United States Patent
Wang et al.

(10) Patent No.: US 11,792,918 B2
(45) Date of Patent: Oct. 17, 2023

(54) CO-AXIAL VIA STRUCTURE

(71) Applicant: Unimicron Technology Corp., Taoyuan (TW)

(72) Inventors: Pei-Wei Wang, Taipei (TW);
Heng-Ming Nien, Taoyuan (TW);
Ching-Sheng Chen, Hsinchu County (TW); Yi-Pin Lin, Taoyuan (TW);
Shih-Liang Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/455,918

(22) Filed: Nov. 21, 2021

(65) Prior Publication Data

US 2022/0240368 A1 Jul. 28, 2022

Related U.S. Application Data

(60) Provisional application No. 63/142,994, filed on Jan. 28, 2021.

(30) Foreign Application Priority Data

Oct. 8, 2021 (TW) .................................. 110137648

(51) Int. Cl.
*H05K 1/02* (2006.01)
*H05K 1/11* (2006.01)

(52) U.S. Cl.
CPC ........... *H05K 1/024* (2013.01); *H05K 1/0222* (2013.01); *H05K 1/112* (2013.01)

(58) Field of Classification Search
CPC ..................... H05K 1/112–1/116; H05K 1/024
See application file for complete search history.

(56) References Cited

U.S. PATENT DOCUMENTS

| | | | |
|---|---|---|---|
| 5,421,083 A | 6/1995 | Suppelsa et al. | |
| 5,949,030 A | 9/1999 | Fasano et al. | |
| 6,479,764 B1 | 11/2002 | Frana et al. | |
| 7,767,913 B2 * | 8/2010 | Corisis | G06F 1/16 |
| | | | 174/262 |
| 8,273,995 B2 * | 9/2012 | Chandrasekraran | |
| | | | H05K 1/0245 |
| | | | 174/262 |

(Continued)

FOREIGN PATENT DOCUMENTS

| | | |
|---|---|---|
| TW | 200534374 A | 10/2005 |
| TW | 200715470 A | 4/2007 |

*Primary Examiner* — Jeremy C Norris
(74) *Attorney, Agent, or Firm* — CKC & Partners Co., LLC

(57) ABSTRACT

A co-axial structure includes a substrate, a first conductive structure, a second conductive structure, and an insulating layer. The substrate includes a first surface. The first conductive structure includes a first circuit deposited on the first surface and a first via penetrating the substrate. The second conductive structure includes a second circuit deposited on the first surface and a second via penetrating the substrate. The first via and the second via extend along a first direction. The first circuit and the second circuit extend along a second direction, and the second direction is perpendicular to the first direction. The insulating layer is located between the first via and the second via. The insulating layer includes a filler. The first conductive structure and the second conductive structure are electrically insulated. The first circuit and the second circuit are coplanar.

7 Claims, 14 Drawing Sheets

(56) References Cited

U.S. PATENT DOCUMENTS

| | | |
|---|---|---|
| 9,706,656 B2 * | 7/2017 | Hsu .................. H05K 1/0251 |
| 10,249,943 B2 | 4/2019 | Brigham |
| 10,448,501 B2 | 10/2019 | Wu |
| 2002/0017399 A1 | 2/2002 | Chang et al. |
| 2002/0134685 A1 | 9/2002 | Chakravorty et al. |
| 2002/0153167 A1 | 10/2002 | Miller |
| 2005/0178585 A1 | 8/2005 | Kim et al. |
| 2005/0247482 A1 | 11/2005 | Nakamura |
| 2006/0082984 A1 | 4/2006 | Wu |
| 2006/0131611 A1 | 6/2006 | Kaluzni et al. |
| 2007/0020914 A1 | 1/2007 | Higashi |
| 2007/0124930 A1 | 6/2007 | Cheng et al. |
| 2007/0230150 A1 | 10/2007 | Castriotta et al. |
| 2008/0000681 A1 | 1/2008 | Nakamura |
| 2011/0095435 A1 | 4/2011 | Volant et al. |
| 2011/0203842 A1 | 8/2011 | Russell |
| 2017/0019994 A1 | 1/2017 | Wu |
| 2017/0150594 A1 | 5/2017 | Jones et al. |
| 2018/0184522 A1 | 6/2018 | Rodriguez et al. |
| 2019/0148300 A1 | 5/2019 | Hung et al. |
| 2019/0159333 A1 | 5/2019 | Sinha et al. |
| 2021/0098436 A1 | 4/2021 | Bharath et al. |

\* cited by examiner

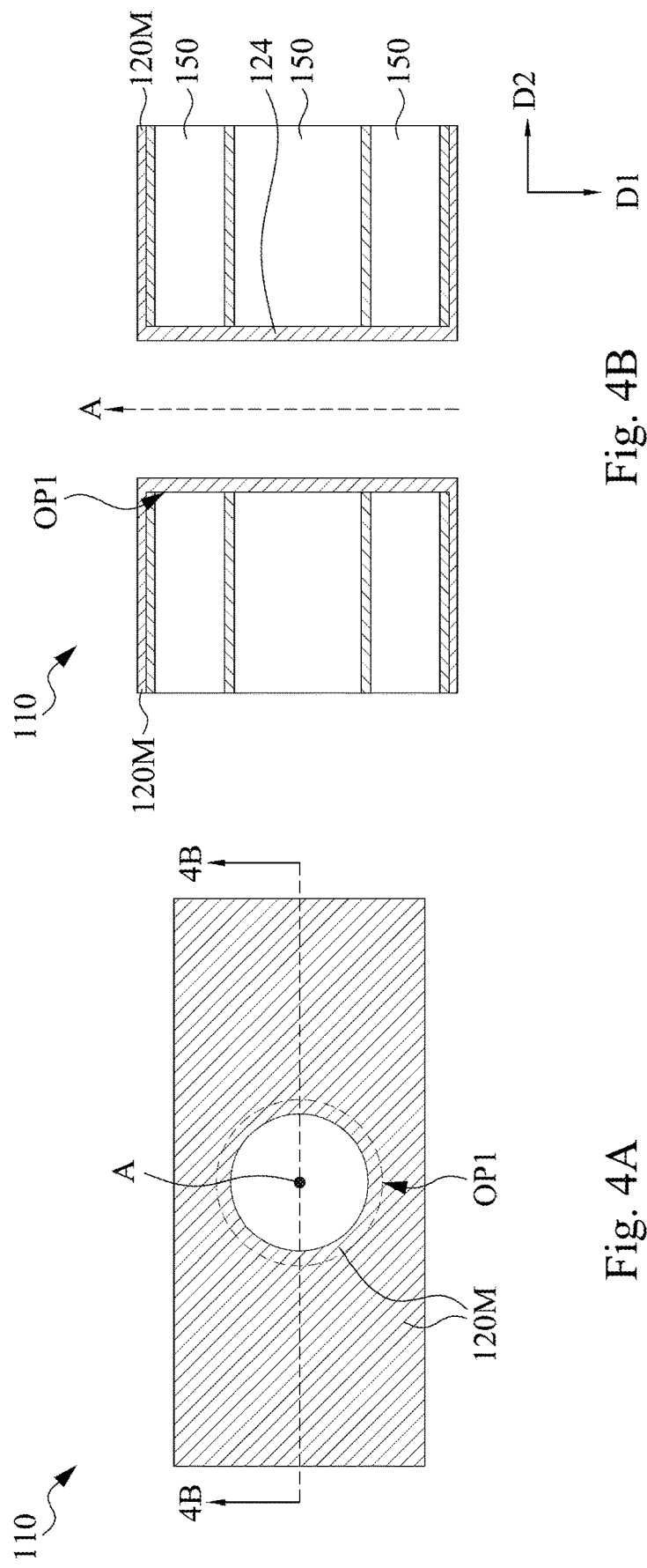

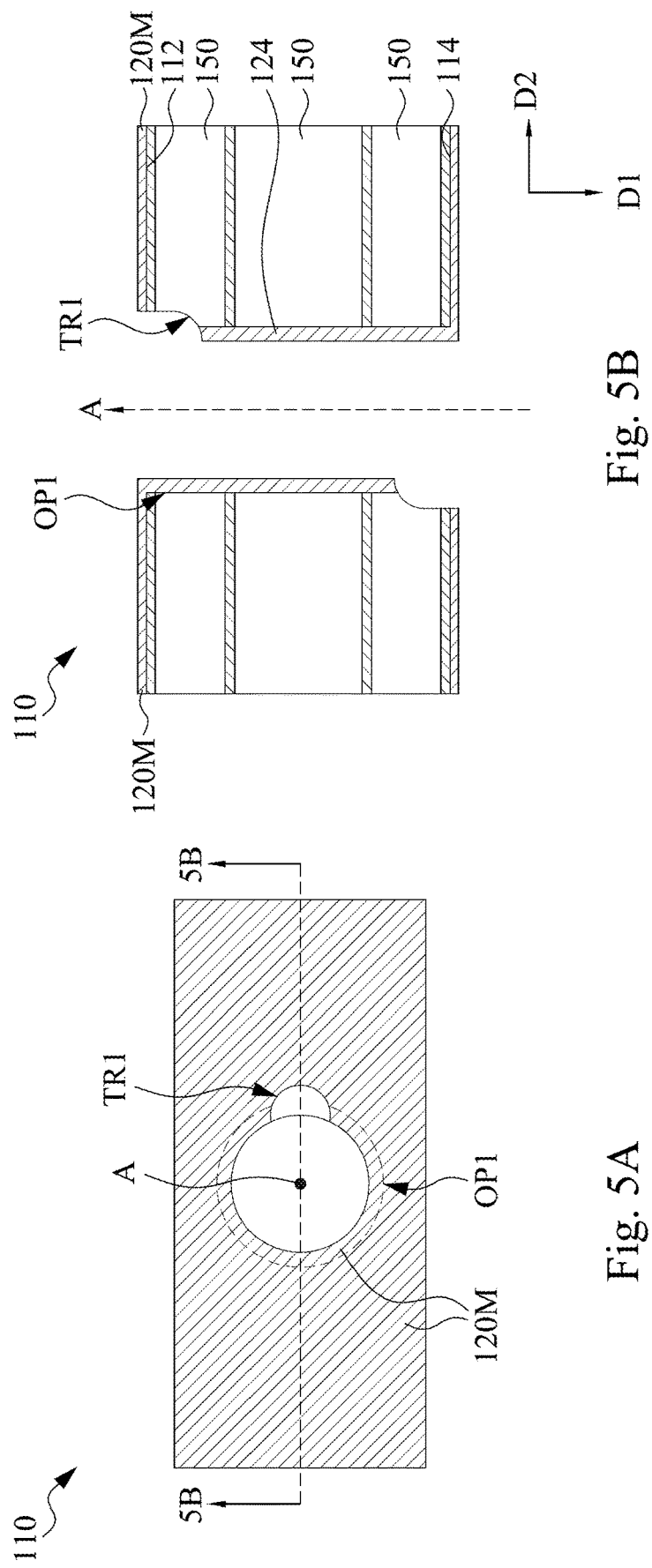

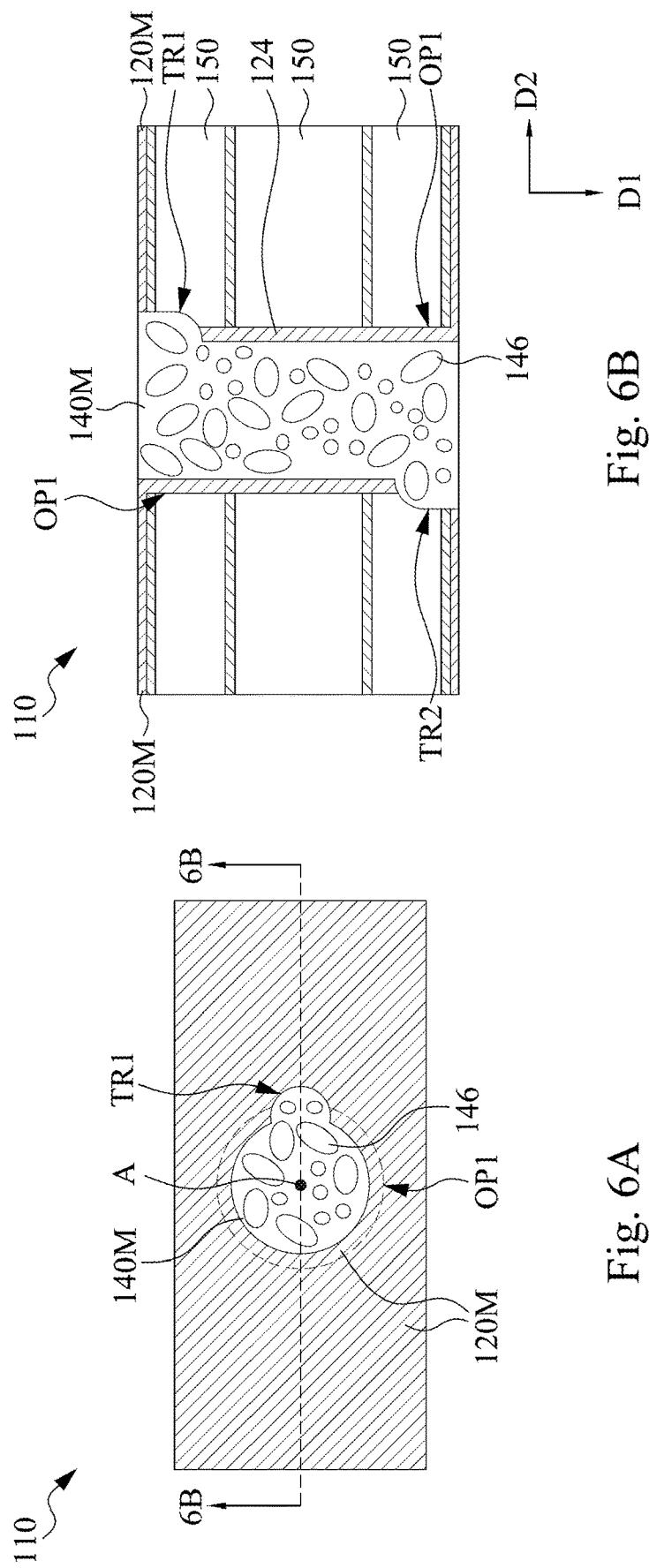

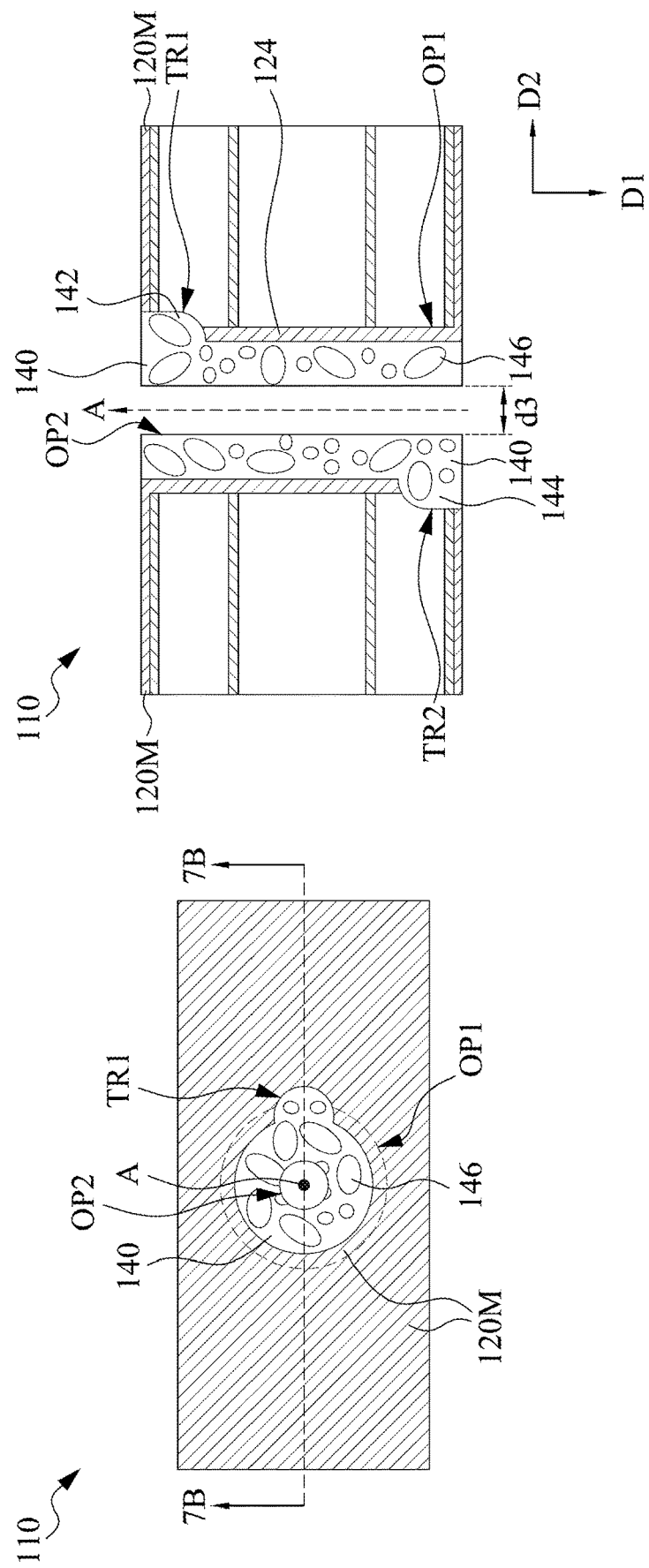

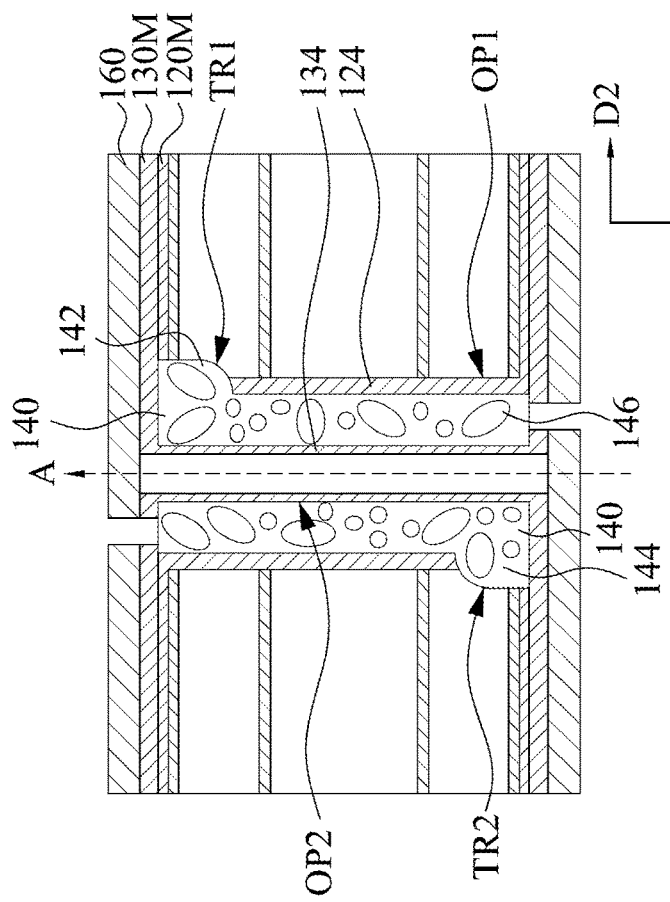
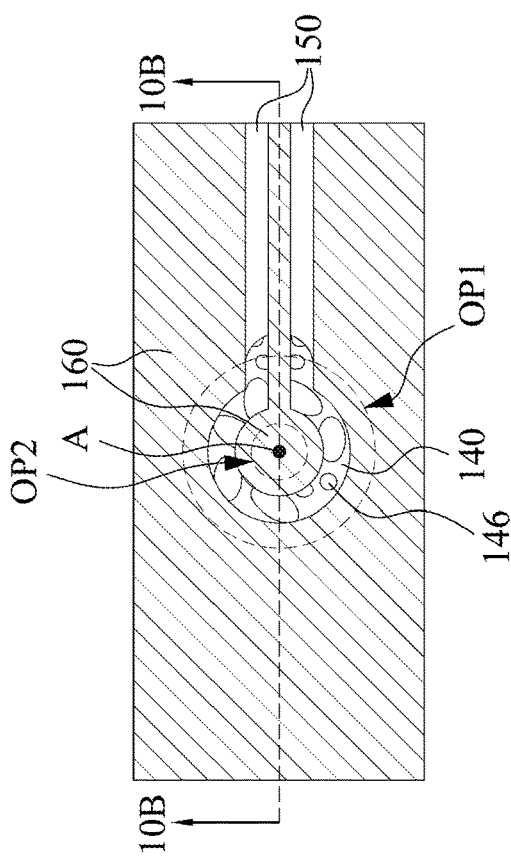

CO-AXIAL VIA STRUCTURE

CROSS-REFERENCE TO RELATED APPLICATION

This application claims priority to U.S. Provisional Application Ser. No. 63/142,994, filed Jan. 28, 2021 and Taiwan Application Series 110137648, filed Oct. 8, 2021, which are herein incorporated by reference in their entireties.

BACKGROUND

Field of Invention

The present invention relates to a co-axial via structure.

Description of Related Art

It is required to add extra dielectric layers between a grounding line and a signal line by a compression process for manufacture a conventional co-axial via structure which may cause greater budget consumption. In addition, inner circuits and outer lines within a via structure are located at different levels, and therefore impedance mismatch problem may occur. The dielectric layer deposited between the grounding line and the signal line may also have shielding notch which may cause poor magnetic shielding efficiency. In addition, since the filler material of the insulating layer usually has high dielectric constant value, which may cause serious impedance mismatch loss problem.

Accordingly, it is still a development direction for the industry to provide a co-axial via structure which can improve impedance match efficiency and magnetic shielding efficiency.

SUMMARY

One aspect of the present disclosure is a co-axial structure.

In some embodiments, the co-axial structure includes a substrate, a first conductive structure, a second conductive structure, and an insulating layer. The substrate includes a first surface. The first conductive structure includes a first circuit deposited on the first surface and a first via penetrating the substrate. The second conductive structure includes a second circuit deposited on the first surface and a second via penetrating the substrate. The first via and the second via extend along a first direction. The first circuit and the second circuit extend along a second direction, and the second direction is perpendicular to the first direction. The insulating layer is located between the first via and the second via, wherein the insulating layer comprises a filler, the first conductive structure and the second conductive structure are electrically insulated, and the first circuit and the second circuit are coplanar.

In some embodiments, the filler includes air.

In some embodiments, the first via of the first conductive structure surrounds the second via of the second conductive structure and the insulating layer.

In some embodiments, the insulating layer, the first via, and the second via are co-axial.

In some embodiments, the insulating layer includes a protruding portion located at an end of the insulating layer close to the first surface.

Another aspect of the present disclosure is a co-axial structure.

In some embodiments, the co-axial structure includes a substrate, a first conductive structure, a second conductive structure, an insulating layer, and an air hole. The substrate includes a first surface. The first conductive structure includes a first circuit deposited on the first surface and a first via penetrating the substrate. The second conductive structure includes a second circuit deposited on the first surface and a second via penetrating the substrate. The first via and the second via extend along a first direction. The first circuit and the second circuit extend along a second direction, and the second direction is perpendicular to the first direction. The insulating layer is located between the first via and the second via, the first conductive structure and the second conductive structure are electrically insulated, and the first circuit and the second circuit are coplanar. The air hole is located between the first via and the second via, and the air hole run through the insulating layer along the first direction.

In some embodiments, the air hole has an arc shape in a plan view, and the air hole surrounds the second via.

In some embodiments, the first via of the first conductive structure surrounds the second via of the second conductive structure and the insulating layer.

In some embodiments, the insulating layer, the first via, and the second via are co-axial.

In some embodiments, the insulating layer includes a protruding portion located at an end of the insulating layer close to the first surface.

In the aforementioned embodiments, since the first circuit and the second circuit of the co-axial via structure are coplanar and the first conductive structure and the second conductive structure are electrically insulated through the insulating layer, the co-axial via structure of the present disclosure can have better magnetic noise shielding efficiency and impedance match efficiency that can improve high frequency signal integrality. In addition, the number of the dielectric layers can be reduced so as to reduce the thickness of the co-axial structure. Therefore, manufacture cost of the co-axial via structure of the present disclosure can be reduced. In addition, the overall dielectric constant value of the insulating layer can be reduced by adding filler or air hole. As such, impedance mismatch loss problem can be reduced.

BRIEF DESCRIPTION OF THE DRAWINGS

The invention can be more fully understood by reading the following detailed description of the embodiment, with reference made to the accompanying drawings as follows:

FIGS. 3A to 11A are top views of intermediate steps of a manufacturing method of a co-axial via structure according to another embodiment of the present disclosure;

FIGS. 3B to 11B are cross-sectional views taken along line 3B-3B to line 11B-11B in FIGS. 3A to 11A, respectively;

DETAILED DESCRIPTION

Figure 1:
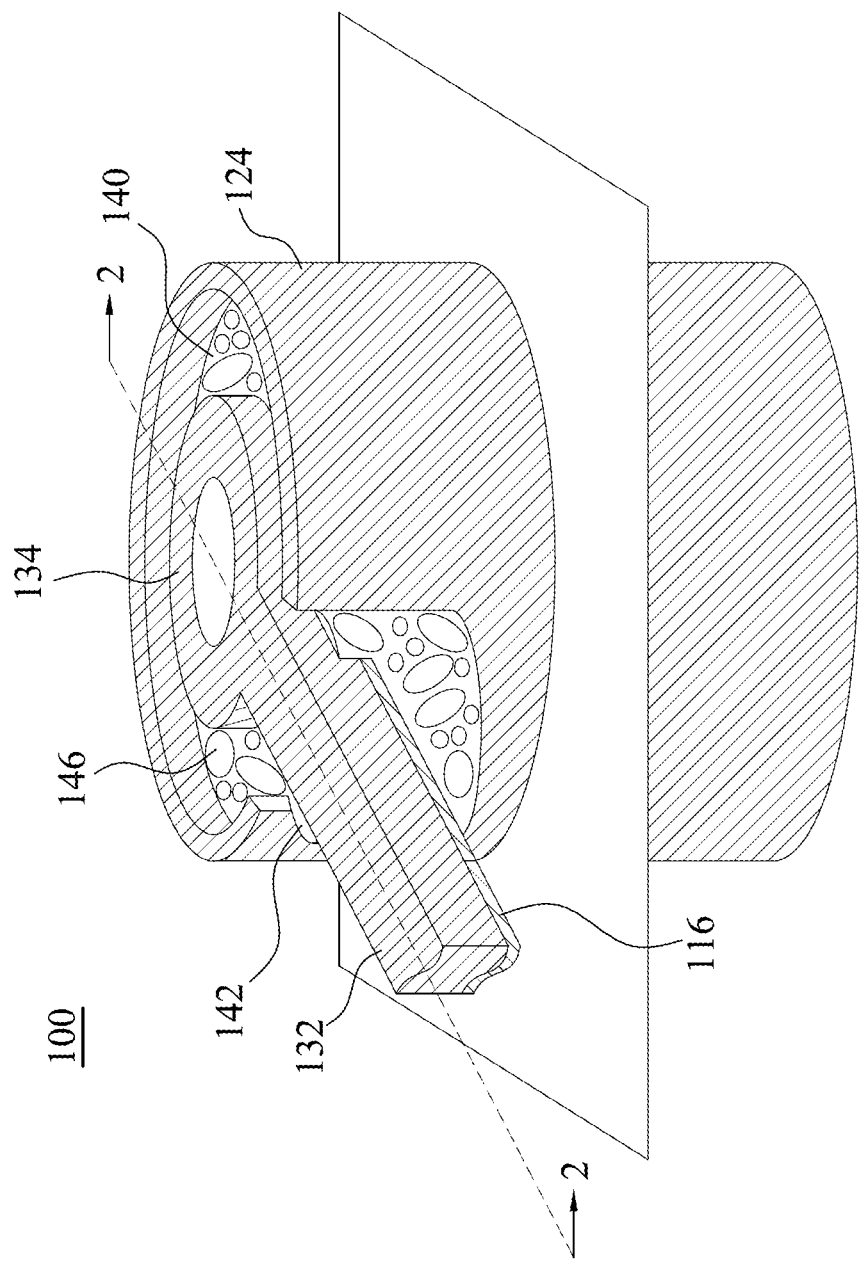
FIG. 1 is a three-dimensional view of the co-axial via structure according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
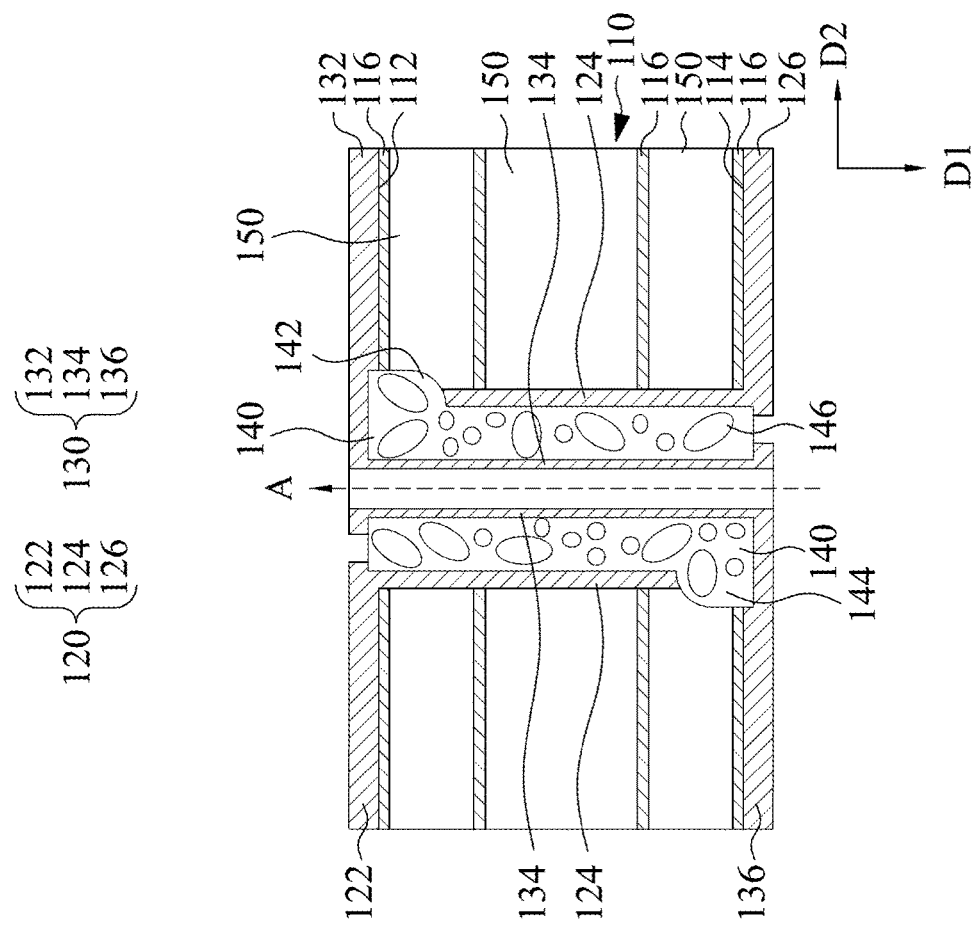
FIG. 2 is a cross-sectional view taken along line 2-2 in FIG. 1.

FIG. 1 is a three-dimensional view of the co-axial via structure 100 according to one embodiment of the present disclosure. FIG. 2 is a cross-sectional view taken along line 2-2 in FIG. 1. Reference is made to FIG. 1 and FIG. 2 simultaneously. The co-axial via structure 100 includes a substrate 110, a first conductive structure 120, a second conductive structure 130, and an insulating layer 140.

The substrate 110 includes a first surface 112 and a second surface 114 opposite to each other. The first conductive structure 120 includes a first circuit 122 and a first via 124, and the second conductive structure 130 includes a second circuit 132 and a second via 134. The first circuit 122 and the second circuit 132 are deposited on the first surface 112. The first via 124 and the second via 134 penetrate the substrate 110. The first via 124 and the second via 134 extend along a first direction D1. The first circuit 122 and the second circuit 132 extend along a second direction D2 perpendicular to the first direction D1. The first circuit 122 of the first conductive structure 120 and the second circuit 132 of second conductive structure 130 are coplanar. In other words, the first circuit 122 and the second circuit 132 are located at the same horizontal plane.

In the present embodiment, the first direction D1 is the vertical direction herein. That is, the first direction D1 is a direction from the first surface 112 to the second surface 114. The second direction D2 can be arbitrary horizontal direction that is perpendicular to the first direction D1. In the present embodiment, the first circuit 122 and the third circuit 126 can be ground lines, and the second circuit 132 and the fourth circuit 136 can be signal lines, but the present disclosure is not limited in those regards.

As shown in FIG. 2, the first conductive structure 120 further includes a third circuit 126 located on the second surface 114, and the second conductive structure 130 further includes a fourth circuit 136 located on the second surface 114. Two ends of the first via 124 are connected with the first circuit 122 and the third circuit 126 respectively. Two ends of the second via 134 are connected with the second circuit 132 and the fourth circuit 136 respectively. The third circuit 126 and the fourth circuit 136 extend along the second direction D2, and the third circuit 126 and the fourth circuit 136 are coplanar. In other words, the third circuit 126 and the fourth circuit 136 are located at the same horizontal plane.

The insulating layer 140 is located between the first via 124 and the second via 134, and the insulating layer 140 extend along the first direction D1. The first via 124 surrounds the second via 134 and the insulating layer 140, and the insulating layer 140 surrounds the second via 134. As shown in FIG. 2, the insulating layer 140, the first via 124, and the second via 134 are co-axial relative to an axis A.

The insulating layer 140 is a filling agent having fillers 146, and the fillers 146 contains air. Since the dielectric constant value (Dk) of air is 1, the overall dielectric constant value of the insulating layer 140 can be reduced by adding air. As such, impedance mismatch loss problem can be reduced.

The insulating layer 140 includes a first protruding portion 142, and the first protruding portion 142 is located at one end of the insulating layer 140 close to the first surface 112. The first protruding portion 142 protrudes away from the second via 134 along the second direction D2. As shown in FIG. 2, the substrate 110 further includes dielectric layers 150 located between the first surface 112 and the second surface 114. In the present embodiment, the substrate 110 further includes multiple inner circuits 116 separated through the dielectric layers 150, but the present disclosure is not limited in this regard. The first protruding portion 142 of the insulating layer 140 is in contact with the dielectric layers 150 close to the first surface 112. In other words, the first protruding portion 142 penetrates through the first via 124 and extends to the dielectric layers 150.

It is noted that, in order to describe the structural relation between the second circuit 132 and the first protruding portion 142, only the first via 124, the second circuit 132, and the insulating layer 140 are illustrated in FIG. 1, and the first circuit 122 is omitted.

As shown in FIG. 2, the first via 124 of the first conductive structure 120, the first protruding portion 142 of the insulating layer 140, and the second circuit 132 of the second conductive structure 130 overlap along the first direction D1. The second circuit 132 of the second conductive structure 130 extends from the second via 134 and cross the first protruding portion 142. In other words, the first via 124 and the second circuit 132 are electrically insulated through the first protruding portion 142, and the first circuit 122 and the second circuit 132 which are co-axial are separated from each other. As such, the first conductive structure 120 and the second conductive structure 130 are electrically insulated.

Accordingly, since the first circuit 122 and the second circuit 132 of the co-axial via structure 100 are coplanar and the first conductive structure 120 and the second conductive structure 130 are electrically insulated, the step of forming extra dielectric layers to electrically insulate a first circuit and a second circuit located at different layers can be omitted. As such, the first via 124 and the second via 134 can have substantially the same height, and therefore the overall structure of the co-axial via structure 100 is more symmetrical so as to improve impedance match efficiency. In addition, since the dielectric layers located at different layers can be omitted, the second via 134 can be prevented from penetrating throughout the insulating layer. As such, the co-axial via structure 100 can avoid poor magnetic shielding due to notch of the shielding structure.

As shown in FIG. 2, the insulating layer 140 further includes a second protruding portion 144, and the second protruding portion 144 is located at one end of the insulating layer 140 close to the second surface 114. The second protruding portion 144 protrudes away from the second via 134 along the second direction D2. The second protruding portion 144 of the insulating layer 140 is in contact with the dielectric layers 150 close to the second surface 114. In other words, the second protruding portion 144 penetrates through the first via 124 and extends to the dielectric layers 150.

As shown in FIG. 2, the first via 124 of the first conductive structure 120, the second protruding portion 144 of the insulating layer 140, and the fourth circuit 136 of the second conductive structure 130 overlap along the first direction D1. The fourth circuit 136 of the second conductive structure 130 extends from the second via 134 and cross the second protruding portion 144. In other words, the first via 124 and the fourth circuit 136 are electrically insulated through the second protruding portion 144, and the third circuit 126 and the fourth circuit 136 are separated from each other. As such, the first conductive structure 120 and the second conductive structure 130 are electrically insulated. As described above, the extension direction of the fourth circuit 136 can be arbitrary horizontal direction that is perpendicular to the first direction D1. FIG. 2 is merely an example, and the present disclosure is not limited in this regard.

It is to be noted that the connection relationships, materials, and advantages of the elements described above will not be repeated. In the following description, a manufacturing method of the co-axial structure will be described.

Figures 3A, 3B:
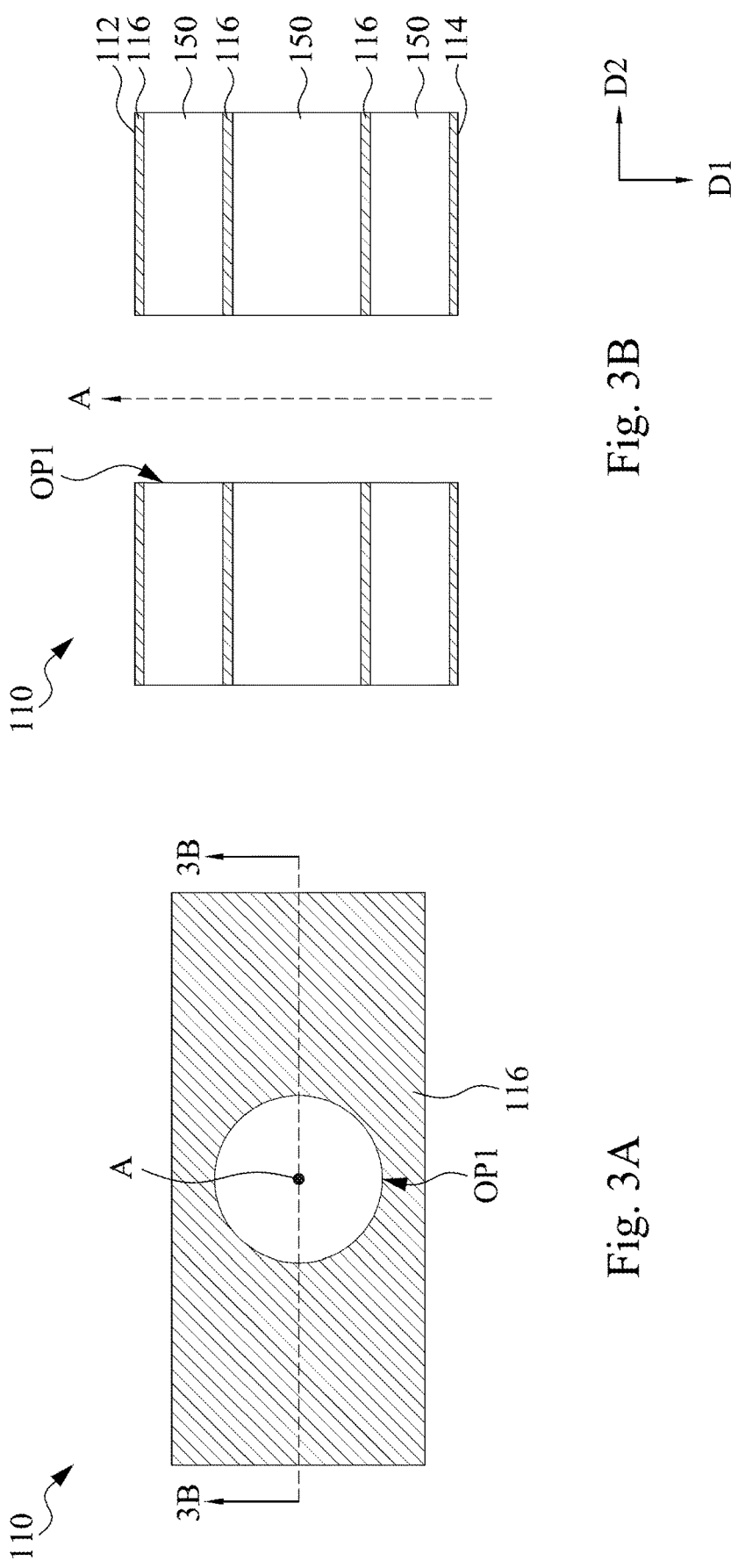

FIGS. 3A to 11A are top views of intermediate steps of a manufacturing method of a co-axial via structure according to another embodiment of the present disclosure. FIGS. 3B to 11B are cross-sectional views taken along line 3B-3B to line 11B-11B in FIGS. 3A to 11A, respectively. As shown in FIG. 3A and FIG. 3B, the manufacturing method of the co-axial structure starts from formed the first through hole OP1 in a substrate 110. The first through hole OP1 penetrates through the inner circuits 116 and the dielectric layers 150 of the substrate 110. For example, the method of forming the first through hole OP1 can be laser drilling.

As shown in FIG. 4A and FIG. 4B, in the manufacturing method of the co-axial via structure, a first conductive material 120M is subsequently formed on the first surface 112, on the second surface 114, and on an inner wall of the first through hole OP1. For example, the method of forming the first conductive material 120M can be electroplating, and the first conductive material 120M includes copper, but the present disclosure is not limited in these regards. A person having ordinary skill in the art can choose suitable method and materials based on practical condition.

As shown in FIG. 5A and FIG. 5B, in the manufacturing method of the co-axial via structure, a first trench TR1 is subsequently formed. The first trench TR1 is recessed from the first surface 112, and the first trench TR1 and the first through hole OP1 communicate with each other. The method of forming the first trench TR1 includes drilling from the first surface 112 through the first direction D1 such that the dielectric layer 150 close to the first surface 112 can be exposed from the first conductive material 120M.

Reference is made to FIG. 5B, this step further includes forming a second trench TR2. The second trench TR2 is recessed from the second surface 114, and the second trench TR2 and the first through hole OP1 communicate with each other. The method of forming the second trench TR2 includes drilling from the second surface 114 through a reversed direction of the first direction D1 such that the dielectric layer 150 close to the second surface 114 can be exposed from the first conductive material 120M. The method of forming the first trench TR1 and the second trench TR2 can be laser drilling.

In a top view of FIG. 5A, a distance between the first trench TR1 and the first through hole OP1 can be derived from the width of the second circuit 132 and an required interval between the first circuit 122 and the second circuit 132. Similarly, in a bottom view (not shown), a distance between the second trench TR2 and the first through hole OP1 can be derived from the width of the fourth circuit 136 and an required interval between the third circuit 126 and the fourth circuit 136.

As shown in FIG. 6A and FIG. 6B, in the manufacturing method of the co-axial via structure, an insulating layer material 140M is filled in the first through hole OP1, the first trench TR1, and the second trench TR2 such that the insulating layer material 140M is in contact with the dielectric layer 150 exposed form the first conductive material 120M. In the present embodiment, the insulating layer material 140M, for example, can include filling paste, but the present disclosure is not limited in this regard. As described above, the insulating layer material 140M having fillers 146 containing air. After filling the insulating layer material 140M, the portion of the insulating layer material 140M protruding from the first surface 112 and the second surface 114 are polished such that a top surface and a bottom surface of the insulating layer 140M are level with the first conductive material 120M, respectively.

As shown in FIG. 7A and FIG. 7B, in the manufacturing method of the co-axial via structure, a second through hole OP2 is subsequently formed in the insulating layer material 140M. In the present embodiment, the second through hole OP2 and the first through hole OP1 are concentric. For example, the method of forming the second through hole OP2 can be laser drilling so as to remove a portion of the insulating layer material 140M. After forming the second through hole OP2, the remained insulating layer material 140M includes a portion that is located in the first through hole OP1 (i.e., the insulating layer 140) and a first protruding portion 142 and a second protruding portion 144 that are respectively located at two opposites of the substrate 110.

Figures 8A, 8B:
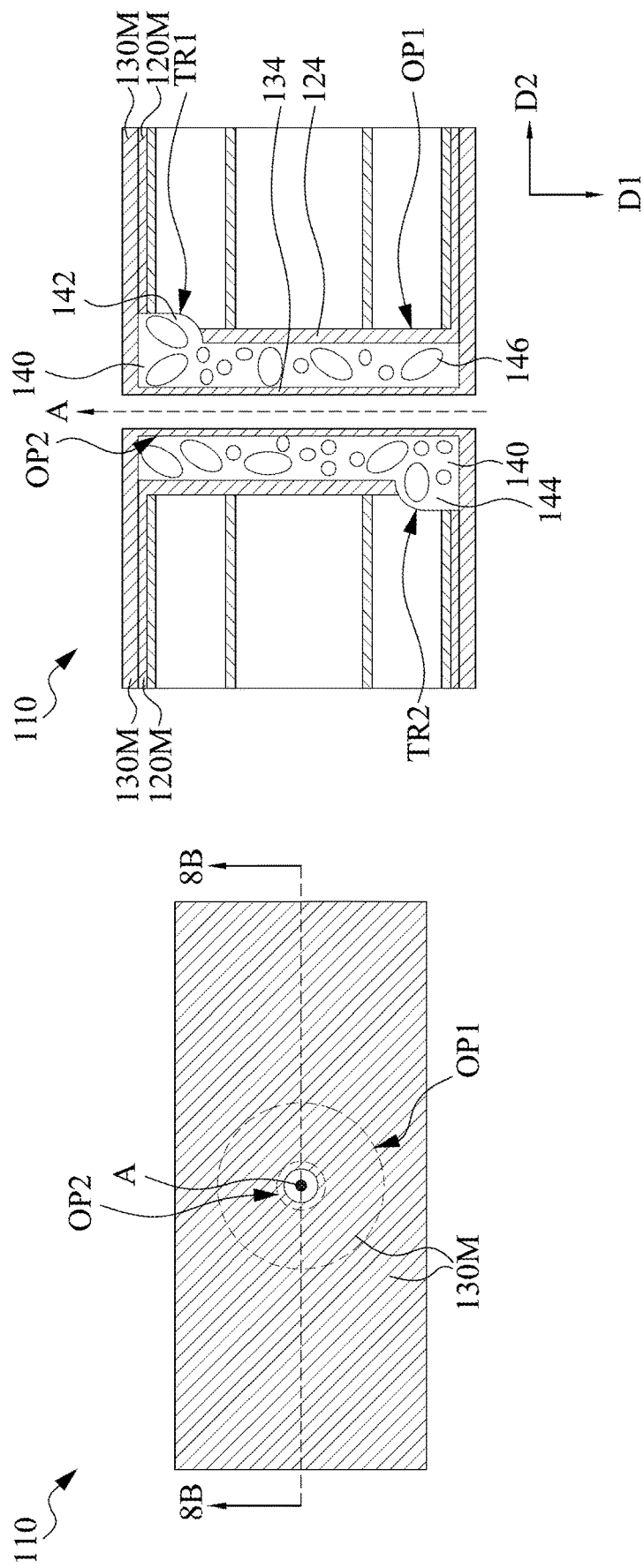

As shown in FIG. 8A and FIG. 8B, in the manufacturing method of the co-axial via structure, a second conductive material 130M is subsequently formed on the first surface 112, on the second surface 114, and on an inner wall of the second through hole OP2. For example, the method of forming the second conductive material 130M can be electroplating, and the second conductive material 130M includes copper, but the present disclosure is not limited in these regards. A person having ordinary skill in the art can choose suitable method and materials based on practical condition.

The second conductive material 130M is in the second through hole OP2, and the first conductive material 120M in the first through hole OP1 (i.e., the first via 124) surrounds the insulating layer 140 and the second conductive material 130M in the second through hole OP2 (i.e., the second via 134) such that the insulating layer 140, the first conductive material 120M in the first through hole OP1, and the and the second conductive material 130M in the second through hole OP2 are co-axial relative to the axis A.

Figure 9B:
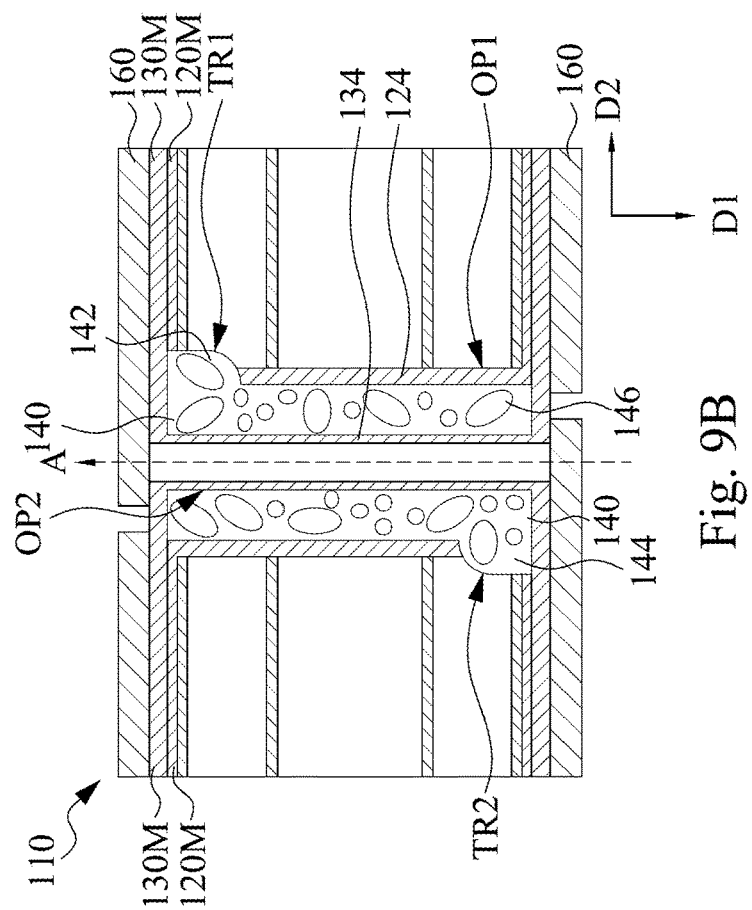
Figure 9A:
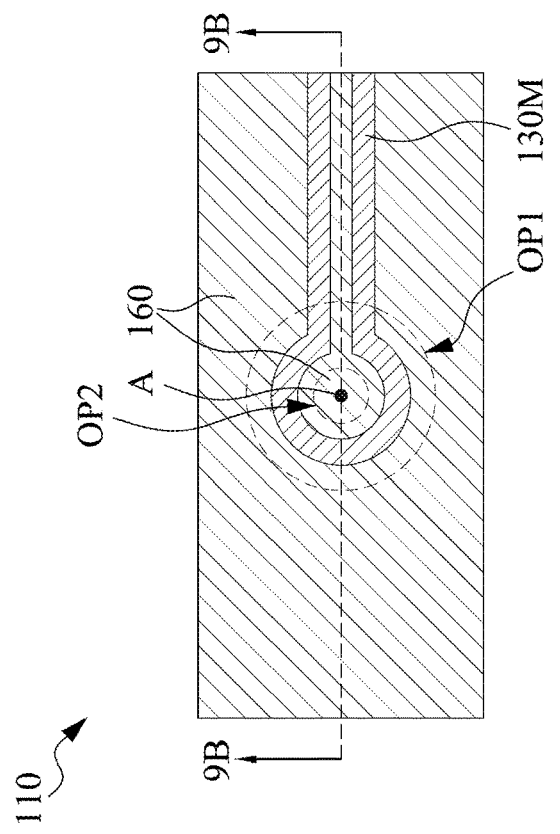

As shown in FIG. 9A and FIG. 9B, in the manufacturing method of the co-axial via structure, a photomask 160 is subsequently formed on the first surface 112 and the second surface 114. The photomask 160 includes patterns used to from the first circuit 122 and the second circuit 132 and patterns used to from the third circuit 126 and the fourth circuit 136.

As shown in FIG. 10A and FIG. 10B, in the manufacturing method of the co-axial via structure, the first conductive material 120M and the second conductive material 130M are subsequently patterned by using the photomask 160. Subsequently, the first conductive material 120M and the second conductive material 130M exposed from the photomask 160 are continuously removed until the insulating layer 140 and the dielectric layer 150 are exposed from the photomask 160.

Reference is made to FIG. 10A, FIG. 10B, FIG. 11A, and FIG. 11B. In the manufacturing method of the co-axial via structure, the photomask 160 is removed later so as to form an insulating protection layer 170. The insulating protection layer 170 includes an opening for connecting with the conductive elements such as metal bump, bump, or solder ball (not shown).

Figure 11B:
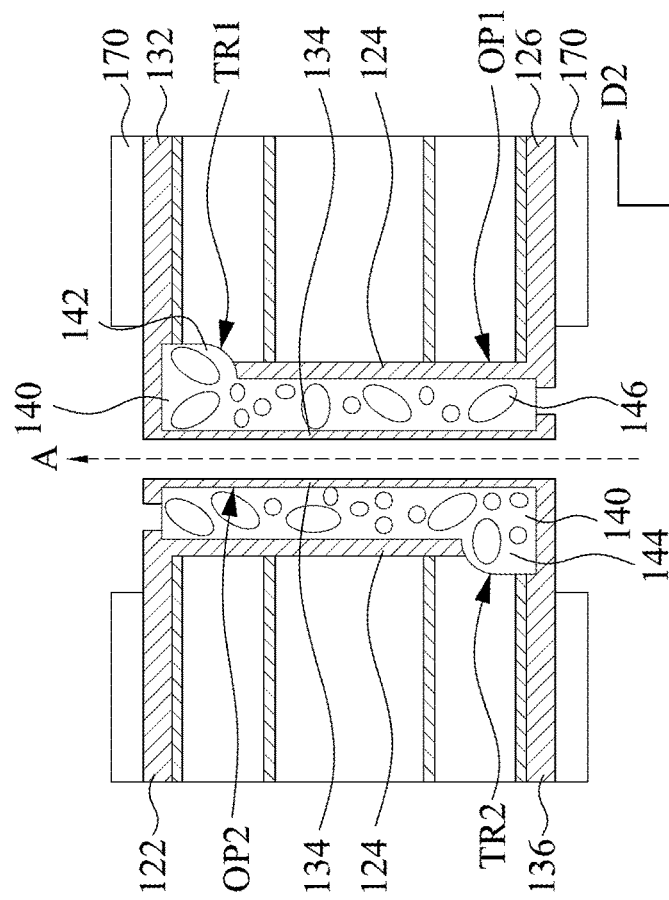

As shown in FIG. 11B, after those steps mentioned above, the first circuit 122 and the second circuit 132 separated from each other are formed, and the first circuit 122 and the second circuit 132 are coplanar. The first via 124 and the second circuit 132 are electrically insulated through the first protruding portion 142 of the first trench TR1. The first circuit 122 can include arbitrary circuit pattern as long as the first circuit 122 and the second circuit 132 can be electrically insulated.

Similarly, after those steps mentioned above, the third circuit 126 and the fourth circuit 136 separated from each other are formed, and the third circuit 126 and the fourth circuit 136 are coplanar. The first via 124 and the fourth circuit 136 are electrically insulated through the second protruding portion 144 of the second trench TR2. The third circuit 126 can include arbitrary circuit pattern (not shown) as long as the third circuit 126 and the fourth circuit 136 can be electrically insulated.

Figure 11A:
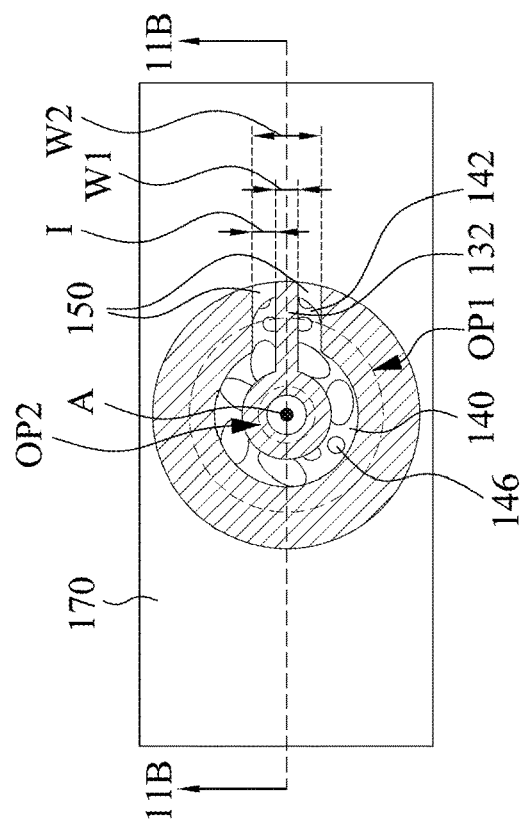

Reference is made to FIG. 11A. In the present embodiment, the second circuit 132 has a width W1, and a junction between the insulating layer 140 and the first protruding portion 142 has a width W2. The width W2 can be adjusted by changing the distance between the first trench TR1 and the first through hole OP1, and the W2 can be determined on the hole diameter of the first trench TR1. Therefore, based on the required width W1, a suitable distance between the first trench TR1 and the first through hole OP1 can be calculated in the step of forming the first trench TR1. As such, the width W2 is guaranteed to be width enough to avoid broken of the second circuit 132. The second circuit 132 and the adjacent first circuit 122 have an interval I therebetween. Under constraints for deriving specific impedance, the interval I can be determined according to a thickness and the width W1 of the second circuit 132, and parameters of the dielectric layer 150 so as to improve impedance match efficiency.

Figure 12A:
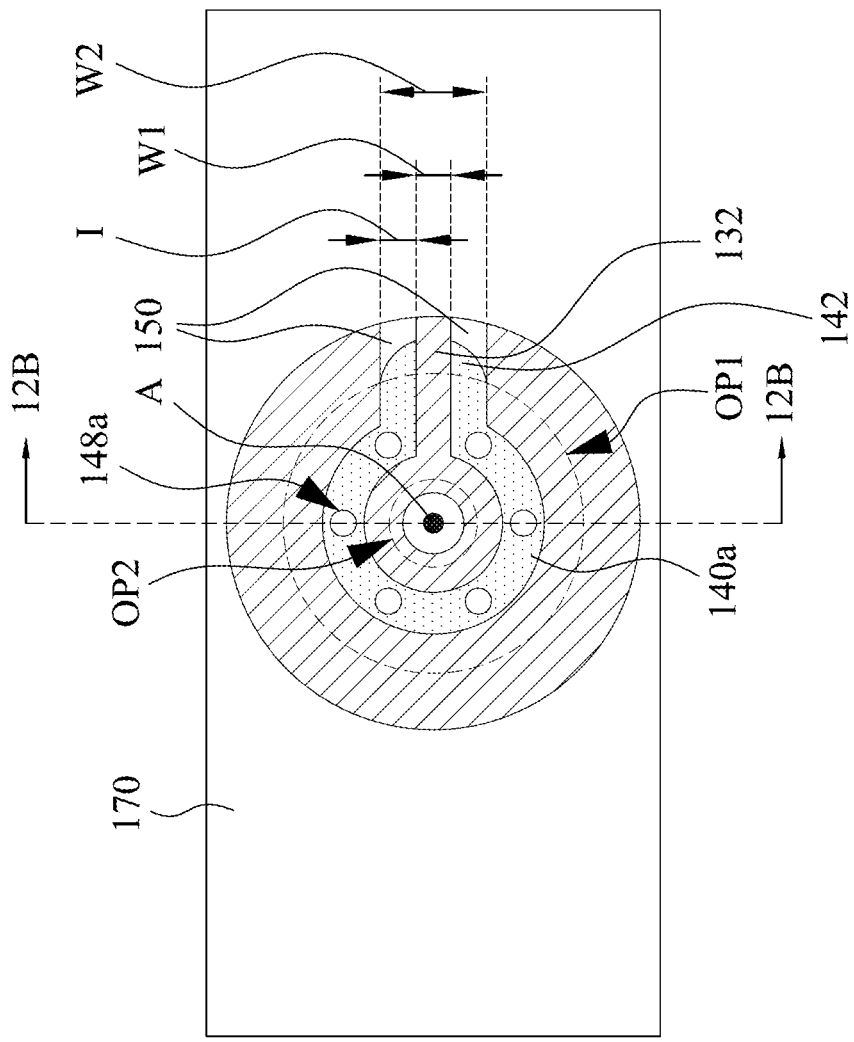
FIG. 12A is a top view of a co-axial via structure according to another embodiment of the present disclosure.
Figure 12B:
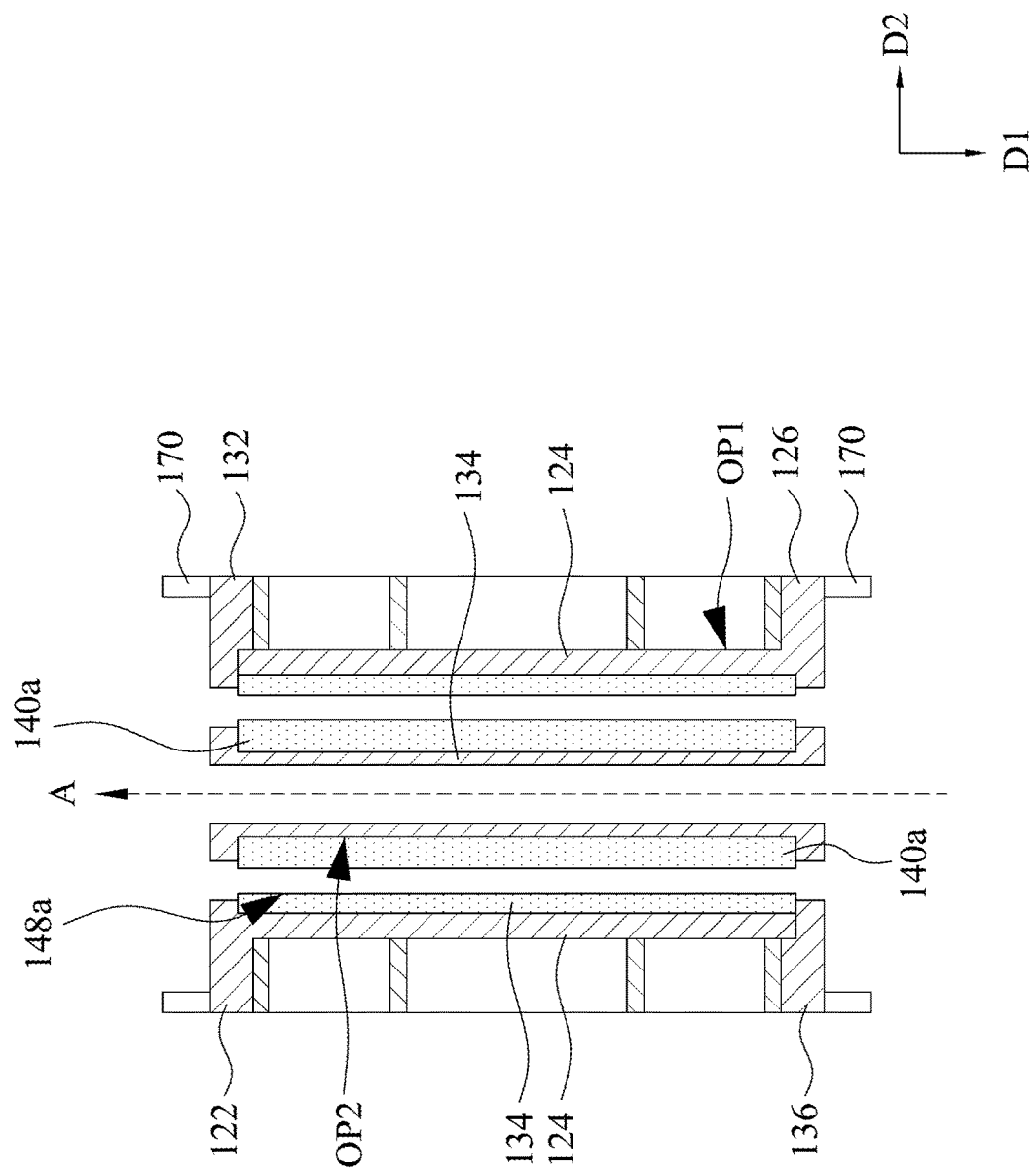
FIG. 12B is a cross-sectional view taken along line 12B-12B in FIG. 12A.

FIG. 12A is a top view of a co-axial via structure 100a according to another embodiment of the present disclosure. FIG. 12B is a cross-sectional view taken along line 12B-12B in FIG. 12A. The co-axial via structure 100a is substantially the same as the co-axial via structure 100 shown in FIG. 2, and the difference is that the insulating layer 140a of the co-axial via structure 100a has no filler 146 (see FIG. 2), and the co-axial via structure 100a has air hole 148a. The air hole 148a is located between the first via 124 and the second via 134. The air hole 148 runs through the insulating layer 140a along the first direction D1. The first direction D1 is substantially the same as the direction entering the plan in FIG. 12A. The air hole 148a can be formed through mechanical drilling. In the present embodiment, the co-axial via structure 100a includes six air holes 148a arranged to surround the second via 134, but the present disclosure is not limited in this regard. Number and size of the air hole 148a can be adjusted according to practical requirement as long as the structure strength of the insulating 140a is large enough to support the second via 134 and the second circuit 132. Since the dielectric constant value (Dk) of air is 1, the overall dielectric constant value of the insulating layer 140a can be reduced through air hole 148a. As such, impedance mismatch loss problem can be reduced.

Figure 13:
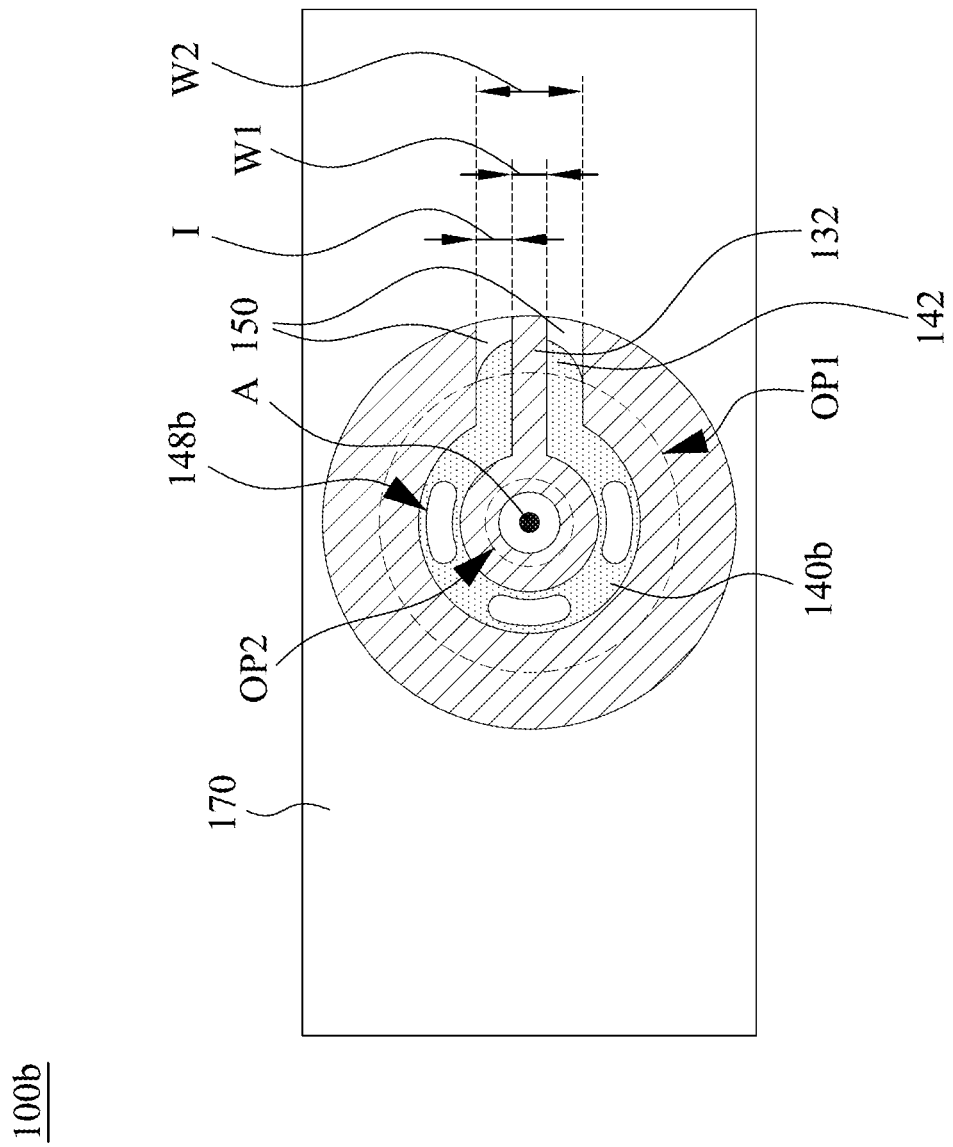
FIG. 13 is a top view of a co-axial via structure according to another embodiment of the present disclosure.

FIG. 13 is a top view of a co-axial via structure 100b according to another embodiment of the present disclosure. The co-axial via structure 100b is substantially the same as the co-axial via structure 100a shown in FIG. 12A, and the difference is that the air hole 148b has an arc shape in a plan view. The first direction D1 is substantially the same as the direction entering the plan in FIG. 13. In other words, the arc-shaped air hole 148a can be considered as slots formed by multiple air holes 148a shown in FIG. 12A. The air hole 148b can be formed through slot milling. In the present embodiment, the co-axial via structure 100a includes three air holes 148b, but the present disclosure is not limited in this regard. Number and size of the air hole 148b can be adjusted according to practical requirement as long as the structure strength of the insulating 140b is large enough to support the second via 134 and the second circuit 132. Since the dielectric constant value (Dk) of air is 1, the overall dielectric constant value of the insulating layer 140b can be reduced through air hole 148b. As such, impedance mismatch loss problem can be reduced.

In summary, since the ground line and the signal line (first circuit and the second circuit) of the co-axial via structure are coplanar and the first conductive structure and the second conductive structure are electrically insulated through the insulating layer, the co-axial via structure of the present disclosure can have better magnetic noise shielding efficiency and impedance match efficiency that can improve high frequency signal integrality. In addition, the number of the dielectric layers can be reduced so as to reduce the thickness of the co-axial structure. Therefore, manufacture cost of the co-axial via structure of the present disclosure can be reduced. In addition, the overall dielectric constant value of the insulating layer can be reduced by adding filler or air hole. As such, impedance mismatch loss problem can be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A co-axial structure, comprising:
   a substrate comprising a first surface;
   a first conductive structure comprising a first circuit deposited on the first surface and a first via penetrating the substrate;
   a second conductive structure comprising a second circuit deposited on the first surface and a second via penetrating the substrate, wherein the first via and the second via extend along a first direction, and a second direction is perpendicular to the first direction; and
   an insulating layer located between the first via and the second via, wherein the insulating layer comprises a filler and a protruding portion, the filler comprises air, the protruding portion is located at an end of the insulating layer close to the first surface, the protruding portion overlaps the substrate along the first direction and the second direction, the first conductive structure and the second conductive structure are electrically insulated, and the first circuit and the second circuit are coplanar.

2. The co-axial structure of claim 1, wherein the first via of the first conductive structure surrounds the second via of the second conductive structure and the insulating layer.

3. The co-axial structure of claim 1, wherein the insulating layer, the first via, and the second via are co-axial.

4. A co-axial structure, comprising:
a substrate comprising a first surface;
a first conductive structure comprising a first circuit deposited on the first surface and a first via penetrating the substrate;
a second conductive structure comprising a second circuit deposited on the first surface and a second via penetrating the substrate, wherein the first via and the second via extend along a first direction, and a second direction is perpendicular to the first direction;
an insulating layer located between the first via and the second via, wherein the insulating layer comprises a protruding portion located at an end of the insulating layer close to the first surface, the protruding portion overlaps the substrate along the first direction and the second direction, the first conductive structure and the second conductive structure are electrically insulated, and the first circuit and the second circuit are coplanar; and
an air hole located between the first via and the second via, and the air hole run through the insulating layer along the first direction.

5. The co-axial structure of claim 4, wherein the air hole has an arc shape in a plan view, and the air hole surrounds the second via.

6. The co-axial structure of claim 4, wherein the first via of the first conductive structure surrounds the second via of the second conductive structure and the insulating layer.

7. The co-axial structure of claim 4, wherein the insulating layer, the first via, and the second via are co-axial.

* * * * *